United States Patent
Gauthier et al.

(10) Patent No.: US 6,871,290 B2
(45) Date of Patent: Mar. 22, 2005

(54) METHOD FOR REDUCING A MAGNITUDE OF A RATE OF CURRENT CHANGE OF AN INTEGRATED CIRCUIT

(75) Inventors: Claude R. Gauthier, Fremont, CA (US); Tyler J. Thorp, Sunnyvale, CA (US); Richard L. Wheeler, San Jose, CA (US); Brian W. Amick, Austin, TX (US)

(73) Assignee: Sun Microsystems, Inc., Santa Clara, CA (US)

( * ) Notice: Subject to any disclaimer, the term of this patent is extended or adjusted under 35 U.S.C. 154(b) by 534 days.

(21) Appl. No.: 09/930,373

(22) Filed: Aug. 14, 2001

(65) Prior Publication Data

US 2003/0037267 A1 Feb. 20, 2003

(51) Int. Cl.[7] .............................. G06F 1/26; G06F 1/32
(52) U.S. Cl. ...................... 713/320; 713/300; 713/340; 320/159; 323/312; 327/380; 327/403; 361/718; 365/226
(58) Field of Search ................................ 713/300, 320, 713/340; 320/159; 323/312; 327/380, 403; 361/718; 365/226; 257/E27.001

(56) References Cited

U.S. PATENT DOCUMENTS

| | | | | |
|---|---|---|---|---|
| 4,421,614 A | * | 12/1983 | Yamaguchi et al. | 205/347 |
| 4,977,341 A | * | 12/1990 | Stein | 327/380 |
| 5,398,318 A | | 3/1995 | Hiraishi et al. | 395/250 |
| 5,424,669 A | | 6/1995 | Teggatz et al. | 327/270 |
| 5,512,854 A | * | 4/1996 | Park | 327/374 |
| 6,246,266 B1 | * | 6/2001 | Bosshart | 326/98 |
| 6,469,895 B1 | * | 10/2002 | Smith et al. | 361/704 |
| 6,650,354 B2 | * | 11/2003 | Morizono et al. | 347/255 |

FOREIGN PATENT DOCUMENTS

| | | | | |
|---|---|---|---|---|
| WO | WO 93/14568 | 7/1993 | | H03K/17/16 |

OTHER PUBLICATIONS

PCT Search Report dated Jan. 2, 2003, 6 pages.

* cited by examiner

*Primary Examiner*—Rehana Perveen
(74) *Attorney, Agent, or Firm*—Osha & May L.L.P.

(57) ABSTRACT

A method for reducing a magnitude of a rate of current change of an integrated circuit is provided. The method uses a plurality of transistors controlled by a finite state machine, such as a counter, to gradually reduce current sourced from a power supply. Further, the finite state machine is controlled by a micro-architectural stage that determines when the integrated circuit needs to be powered down.

15 Claims, 2 Drawing Sheets

METHOD FOR REDUCING A MAGNITUDE OF A RATE OF CURRENT CHANGE OF AN INTEGRATED CIRCUIT

BACKGROUND OF INVENTION

As technology improves, integrated circuits, such as microprocessors, continue to become faster and more powerful. However, the benefits of increased speed and higher data throughput must be balanced with the costs of increased power consumption and higher operating temperatures.

When a microprocessor (also known in the art as a "central processing unit" or "CPU") approaches or exceeds a certain power or temperature threshold, the microprocessor must be powered down to avoid microprocessor malfunction or damage. For example, if a microprocessor's cooling system fails, the microprocessor must be shut down quickly in order to avoid overheating. Similarly, if a microprocessor is drawing power in a manner that adversely affects other computer chip components, the microprocessor must be powered down to avoid undesirable effects.

However, the high-power nature of a microprocessor makes it difficult to power the microprocessor down instantly because doing so might cause damage to a computer chip's power supplies. The magnitude of such an instant change in current would be so high that a large change in voltage might result potentially damaging not only power supplies, but also computer chip components. Equation 1 shows the relationship between voltage, change in time, and change in current:

$$V = Z * i \quad (1)$$

where V represents voltage, Z represents impedance, and i represents current. Thus, it follows that when i is instantly decreased, V decreases at a rate that a typical computer chip cannot sustain.

FIG. 1 shows a typical relationship (10) between current and time when power to a microprocessor, or other integrated circuit, is decreased instantly to a desired level. Particularly, FIG. 1 shows the rate of current change, $\Delta i/\Delta t$, when current is reduced from 10 amps to 5 amps.

SUMMARY OF THE INVENTION

According to one aspect of the present invention, a method for reducing a magnitude of a rate of current change for an integrated circuit comprises determining when power consumption by the integrated circuit needs to be reduced and gradually reducing an amount of current sourced by a power supply based on the determination.

According to another aspect, a method for reducing a magnitude of a rate of current change for an integrated circuit comprises a step of determining when power consumption by the integrated circuit needs to be reduced and a step of gradually reducing an amount of current sourced by a power supply based on the determination.

Other aspects and advantages of the invention will be apparent from the following description and the appended claims.

BRIEF DESCRIPTION OF DRAWINGS

FIG. 2b shows a relationship between current and time in accordance with the embodiment shown in FIG. 2a.

DETAILED DESCRIPTION

The present invention relates to a method and apparatus for reducing a magnitude of a rate of current change of a microprocessor or other integrated circuit. Further, the present invention relates to a method and apparatus for powering down a microprocessor or other integrated circuit. Further, the present invention relates to a method and apparatus for cooling down a microprocessor or other integrated circuit.

Figure 1:
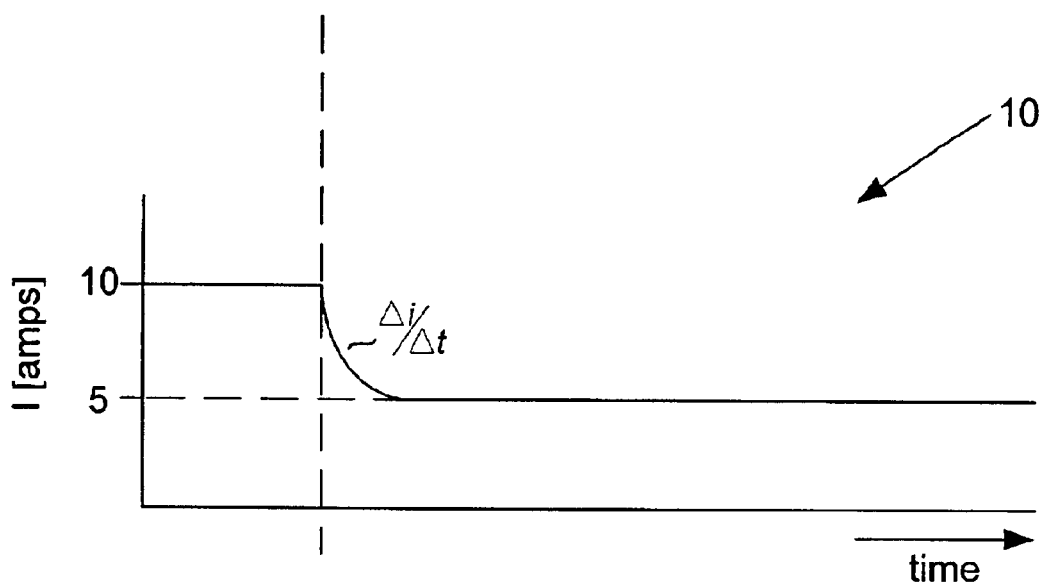
FIG. 1 shows a typical relationship between current and time when power is reduced.
Figure 2A:
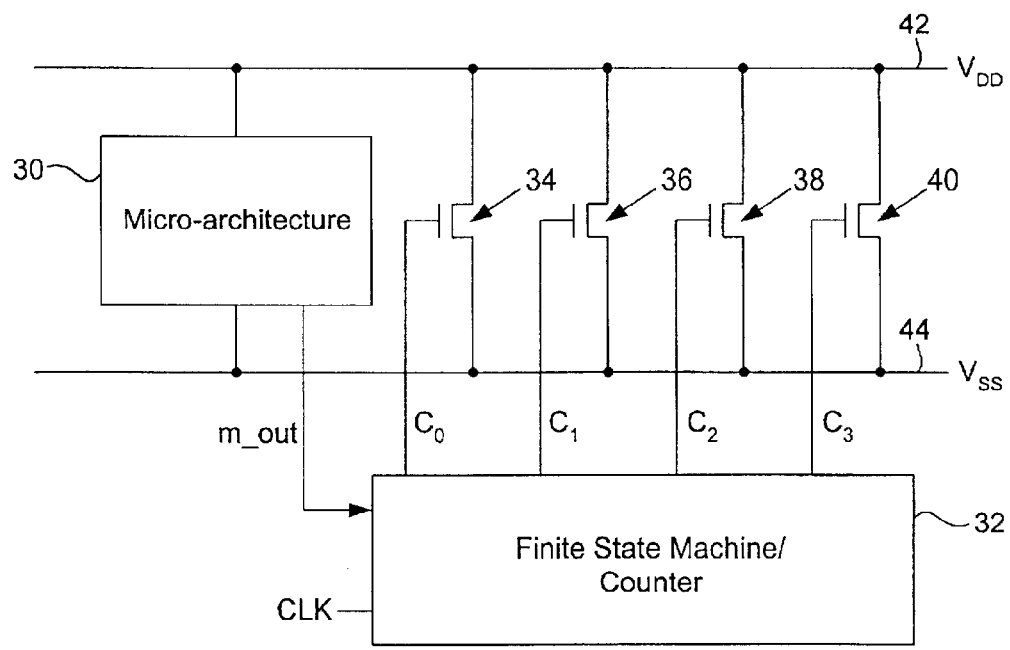
FIG. 2a shows a diagram of a circuit in accordance with an embodiment of the present invention.

FIG. 2a shows a diagram of an exemplary circuit in accordance with an embodiment of the present invention. Particularly, FIG. 2a shows a micro-architectural block (also referred to as "micro-architectural stage") (30) that generates a signal, m_out, to control a counter block (also referred to as "counter stage") (32), where the counter block (32) may include a finite state machine such as a counter (not shown). The counter block (32), which inputs a clock signal, CLK, for timing and counting purposes, generates signals, $C_0$, $C_1$, $C_2$, and $C_3$, to a first transistor (34), a second transistor (36), a third transistor (38), and a fourth transistor (40), respectively. When a particular transistor shown in FIG. 2a is 'on,' i.e., enabled, that particular transistor behaves as a current source in that it sources current from $V_{DD}$ (42) to $V_{SS}$ (44). When a particular transistor is 'off,' i.e., is disabled, the current sourced through that particular transistor is decreased.

The counter block (32) generates a low signal successively on $C_0$, $C_1$, $C_2$, and $C_3$ on positive edges of CLK. However, those skilled in the art will appreciate that in other embodiments, the counter block (32) may be designed differently.

Those skilled in the art will also appreciate that in other embodiments, a different amount of signals generated by the counter block (32) may be used. Further, those skilled in the art will appreciate that in other embodiments, a different amount of transistors may be used. Further, those skilled in the art will appreciate that the micro-architectural block (30) may be a thermal sensor that is used to power down a microprocessor when the microprocessor is about to or begins to overheat.

Figure 2B:
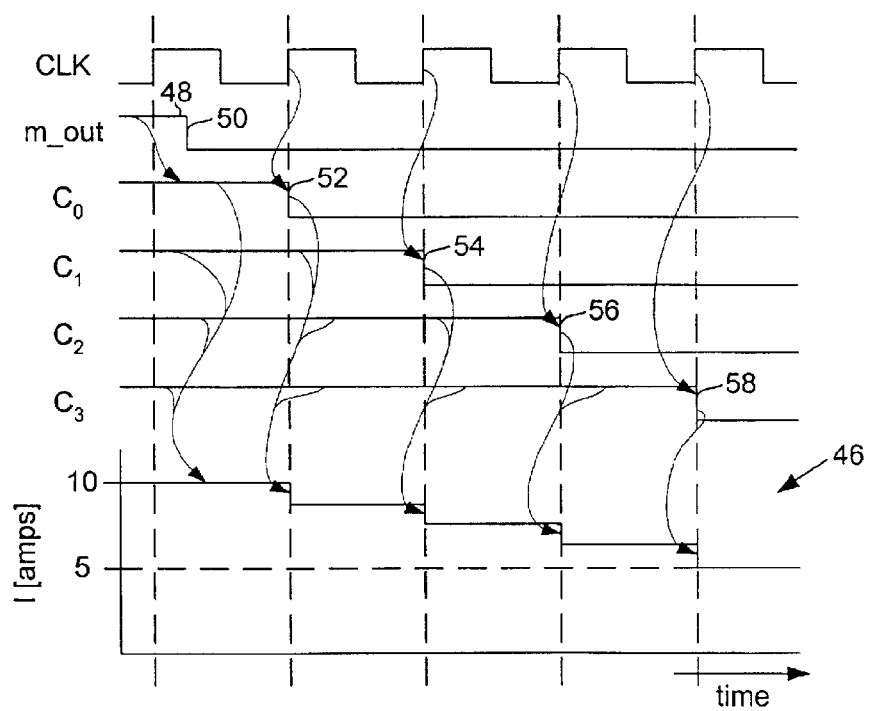

FIG. 2b shows a relationship (46) between current and time based on the signals and circuit shown in FIG. 2a. When m_out is high (48), the counter block (32) generates high values on $C_0$, $C_1$, $C_2$, and $C_3$, where, in turn, the first, second, third, and last transistors (34, 36, 38, 40) are all switched 'on.' In this case, the transistors (34, 36, 38, 40) collectively source 10 amps from $V_{DD}$ (42) to $V_{SS}$ (44).

When m_out goes low (50), the counter block (32) generates low values on $C_0$, $C_1$, $C_2$, and $C_3$ successively at positive edges on CLK. Thus, at the first positive edge on CLK after m_out goes low (50), the counter block (32) generates a low value on $C_0$ (52), which, in turn, causes the first transistor (34) to switch 'off,' effectively reducing the collective current sourced by the transistors (34, 36, 38, 40) from $V_{DD}$ (42) to $V_{SS}$ (44). At the next positive edge on CLK, the counter block (32) generates a low value on $C_1$ (54), which, in turn, causes the second transistor (36) to switch 'off,' effectively reducing the collective current sourced by the transistors (34, 36, 38, 40) from $V_{DD}$ (42) to $V_{SS}$ (44). At the next positive edge on CLK, the counter block (32) generates a low value on $C_2$ (56), which, in turn, causes the third transistor (38) to switch 'off,' effectively reducing the collective current sourced by the transistors (34, 36, 38, 40) from $V_{DD}$ (42) to $V_{SS}$ (44). At the next positive edge on CLK after m_out goes low (50), the counter block (32) generates a low value on $C_3$ (58), which, in turn, causes the last transistor (40) to switch 'off,' effectively reducing the collective current sourced by the transistors (34, 36, 38, 40) from $V_{DD}$ (42) to $V_{SS}$ (44).

Those skilled in the art will appreciate that whenever a transistor is disabled, the amount of reduction of current sourced from $V_{DD}$ (42) to $V_{SS}$ (44) is less than in the case where only one transistor is used to source current from $V_{DD}$ (42) to $V_{SS}$ (44). Thus, by gradually reducing the current sourced from $V_{DD}$ (42) to $V_{SS}$ (44), the magnitude of the rate of current change, or $\Delta i/\Delta t$, is less than in the case where the current reduction is effected by simply instantly reducing the current to a desired level.

Advantages of the present invention may include one or more of the following. In some embodiments, because a plurality of transistors are used to reduce power consumption, a magnitude of a rate of current change of a microprocessor is reduced, and the microprocessor runs quieter, i.e., less noise, than when only one transistor is used to reduce power consumption.

In some embodiments, because a magnitude of a rate of current change of a microprocessor is reduced gradually as opposed to suddenly, the microprocessor operates faster.

In some embodiments, because a magnitude of a rate of current change of a microprocessor is reduced gradually instead of suddenly, the chance of power supply damage is reduced.

In some embodiments, because a magnitude of a rate of current change of a microprocessor is reduced gradually as opposed to suddenly, the effect on average power consumption is reduced.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for reducing a magnitude of a rate of current change for an integrated circuit, comprising:
   determining when power consumption by the integrated circuit needs to be reduced; and
   gradually reducing an amount of current sourced by a power supply based on the determination, wherein the gradually reducing comprises:
      sequentially switching a plurality of devices connected to the power supply.

2. The method of claim 1, wherein gradually reducing the amount of current comprises:
   selectively disabling a first transistor based on the determination, wherein disabling the first transistor causes a reduction in an amount of current sourced from a power supply; and
   selectively disabling a second transistor based on the determination, wherein disabling the second transistor causes a reduction in the amount of current sourced from the power supply.

3. The method of claim 2, wherein the determination is made by a micro-architectural stage, the micro-architectural stage comprising:
   selectively generating a signal to a counter stage, wherein the counter stage generates a first signal to the first transistor and a second signal to the second transistor.

4. The method of claim 3, wherein the counter stage comprises at least one selected from the group consisting of a finite state machine and a counter.

5. The method of claim 2, further comprising:
   selectively disabling a last transistor based on the determination, wherein disabling the last transistor causes a reduction in the amount of current sourced from the power supply.

6. The method of claim 5, wherein the determination is made by a micro-architectural stage, the micro-architectural stage comprising:
   selectively generating a signal to a counter stage, wherein the counter stage generates a last signal to the last transistor.

7. The method of claim 5, wherein the counter stage comprises at least one selected from the group consisting of a finite state machine and a counter.

8. The method of claim 5, further comprising:
   selectively enabling the first, second, and last transistors when power consumption by the integrated circuit does not need to be reduced.

9. The method of claim 5, wherein the first, second, and last transistor can each be one selected from the group consisting of a p-type transistor and a n-type transistor.

10. A method for reducing a magnitude of a rate of current change for an integrated circuit, comprising:
    a step of determining when power consumption by the integrated circuit needs to be reduced; and
    a step of gradually reducing an amount of current sourced by a power supply based on the determination, wherein the step of gradually reducing comprises:
       a step of sequentially switching a plurality of devices connected to the power supply.

11. The method of claim 10, wherein the step of gradually reducing the amount of current comprises:
    a step of selectively disabling a first transistor based on the step of determining, wherein disabling the first transistor causes a reduction in an amount of current sourced from a power supply; and
    a step of selectively disabling a second transistor based on the step of determining, wherein disabling the second transistor causes a reduction in an amount of current sourced from a power supply.

12. The method of claim 11, wherein the step of determining is made by a micro-architectural stage, the micro-architectural stage comprising:
    a step of selectively generating a signal to a counter stage, wherein the counter stage generates a first signal to the first transistor and a second signal to the second transistor.

13. The method of claim 11, further comprising:
    a step of selectively disabling a last transistor based on the step of determining, wherein disabling the last transistor causes a reduction in the amount of current sourced from the power supply.

14. The method of claim 11, wherein the step of determining is made by a micro-architectural stage, the micro-architectural stage comprising:
    a step of selectively generating a signal to a counter stage, wherein the counter stage generates a last signal to the last transistor.

15. The method of claim 13, further comprising:
    a step of selectively enabling the first, second, and last transistors when power consumption by the integrated circuit does not need to be reduced.

* * * * *